United States Patent

Hwang

[11] Patent Number: 5,955,383
[45] Date of Patent: Sep. 21, 1999

[54] METHOD FOR CONTROLLING ETCH RATE WHEN USING CONSUMABLE ELECTRODES DURING PLASMA ETCHING

[75] Inventor: Yuan-Ko Hwang, Hualien, Taiwan

[73] Assignee: Taiwan Semiconductor Manufacturing Company Ltd., Hsin-Chu, Taiwan

[21] Appl. No.: 08/787,196

[22] Filed: Jan. 22, 1997

[51] Int. Cl.[6] .................................................. H01L 21/00
[52] U.S. Cl. ................................ 438/729; 438/14; 216/59
[58] Field of Search ................................... 438/7, 8, 9, 14, 438/729, FOR 101, FOR 102, FOR 141, FOR 142; 216/67, 71, 59; 204/298.03, 298.32, 192.13, 192.33; 156/345; 118/723 R, 723 E, 712, 714

[56] References Cited

U.S. PATENT DOCUMENTS

| | | | |
|---|---|---|---|
| 4,609,562 | 9/1986 | Isenberg et al. | 427/8 |
| 4,886,547 | 12/1989 | Mizukami et al. | 75/0.5 C |
| 5,138,973 | 8/1992 | Davis et al. | 118/723 |
| 5,245,153 | 9/1993 | Singer et al. | 219/76.15 |
| 5,336,355 | 8/1994 | Zarowin et al. | 156/345 |
| 5,344,542 | 9/1994 | Maher et al. | 204/298.15 |
| 5,354,413 | 10/1994 | Smesny et al. | 156/627 |
| 5,387,842 | 2/1995 | Roth et al. | 315/111.21 |
| 5,635,021 | 6/1997 | Harafuji | 437/714 |
| 5,645,642 | 7/1997 | Nishizato et al. | 118/692 |
| 5,652,029 | 7/1997 | Itoh | 427/569 |

*Primary Examiner*—Bruce Breneman
*Assistant Examiner*—Luz Alejandro
*Attorney, Agent, or Firm*—George O. Saile; Stephen B. Ackerman

[57] ABSTRACT

A method and apparatus to improve process control during plasma etching of semiconductor substrates. Improvements are directed towards controlling the rate of etching when using consumable electrodes. Consumable electrode materials are used to increase selectivity in certain plasma etching processes as in via. contact. or in SOG etch. A consumable electrode material has a significant effect on processing time due to changing gap dimension between electrodes. This invention teaches how to adjust for process variables by using feedback from two strategically placed pressure manometers.

6 Claims, 7 Drawing Sheets

METHOD FOR CONTROLLING ETCH RATE WHEN USING CONSUMABLE ELECTRODES DURING PLASMA ETCHING

BACKGROUND OF THE INVENTION

1. Technical Field

This invention applies generally to plasma etching of semiconductor materials and more particularly to a novel process and apparatus for maintaining the gap between a consumable upper electrode and a lower electode, thereby, maintaining a more effective etching rate.

2. Description of the Prior Art

The following three documents relate to various methods dealing with moveable electrodes in plasma etch systems.

U.S. Pat. No. 5,354,413 issued Oct. 11, 1994 to Smesny et al, discloses an electrode position controller for a semiconductor etching device that is calibrated each time the etching device is turned on.

U.S. Pat. No. 5,344,542 issued Sep. 6, 1994 to Mahar et al, teaches a plasma etch system that has electrodes that are moveable so as to provide a selectable gap for either a single or multiple step processing modes.

U.S. Pat. No. 5,336,355 issued Aug. 9, 1994 to Zarowin et al, shows a method and apparatus for confinement of a plasma etch region for precision shaping or contouring surfaces of substances and films.

It is well known that during the manufacturing of silicon-based semiconductor devices the goal of the contact or via etch processes is to obtain a minimum dimension, high aspect ratio hole in silicon dioxide with straight walls, and selectivity to etch silicon or polysilicon.

The gas ratio of F:C (Fluorine:Carbon) limits the selectivity of silicon dioxide to etch either silicon or polysilicon during the etching process. Varying this ratio directly affects selectivity. Fundamentally, selectivity can be increased by reducing the F radical concentration or by increasing the C radical concentration. The fluorine atoms contribute to a faster etch rate on silicon than on silicon dioxide thereby reducing selectivity. Carbon atoms, on the other hand, operate as a polymer source that slows the etch rate thus increases selectivity. It has been found that selectivity can be increased significantly by adding $H_2$ which reacts with F to form HF so that the F concentration in process is reduced. It is also found that selectivity is reduced by adding oxygen, which combines with carbon from reaction gas of $CF_3$ and liberates F so that the F radical concentration is increased.

In addition to adding a different gas to achieve a desired selectivity, the same result is achieved by using a commercially available electrode made from either silicon or graphite materials for varying the F:C ratio. Silicon works to dissipate the F radical concentration while graphite provides the carbon source to vary the F:C ratio. The electodes erode with time thus affecting the etch rate of silicon dioxide. The rate may increase or decrease as the electrode is consumed.

The gap dimension and parallism between the two electrodes are critical calibration steps that are performed manually during machine maintenance. This procedure is sufficient for non-consumable electrodes due to its planar and smooth surface, however, when using consumable electrodes, the profile erodes forming a concave shape with enlarged gas distribution holes thereby precluding accurate calibration.

SUMMARY OF THE INVENTION

The present invention provides a method and apparatus to improve process control and selectivity during plasma etching of semiconductor substrates when using consumable electrodes.

It is a primary object of the present invention to improve etch rate by providing an in-process feedback that is used for updating gap counts for automatically driving a gap driver for adjusting the gap height to a home position for consumable electrodes.

It is another object of the present invention to further improve the etch rate by providing a method and apparatus for monitoring and holding the gas pressure gradient between electrodes to a desired and constant value.

In accordance with the objects of this invention, a new method is provided to improve process control during plasma etching of semiconductor materials. Gap height can be automatically adjusted on-line or off-line. On-line denotes that the gap controller adjusts the gap height assuring the upper electrode gap pressure (GP) equals set point for each part before the etch process begins. Off-line denotes that adjustment is done only after a preset number of wafers have been processed. When the preset number of wafers are completed and the GP still equals the set point (meaning the electrode gap is still within an acceptable gap dimension), the wafer count is reset to zero and the etching process continues without need to reset the gap height.

Two capacitance manometers are used, to obtain and control the pressure gradient between the upper and lower electrodes. The first manometer senses the chamber pressure (CP) and provides pressure feedback to a pressure controller that adjusts a throttle valve to proportionately maintain a constant chamber pressure. A second manometer is used to provide gap pressure feedback to a gap controller thus converting the upper electrode gap pressure into dimensional gap counts used for driving the gap driver to a new position. The etching process does not start until the CP and GP meet set point. The desired control options, on-line or off-line, gap height, tolerances, CP, GP, and wafer count can be written in process recipes or installed in equipment configuration.

DETAILED DESCRIPTION OF THE PREFERRED EMBODIMENT

An aspect of the present invention comprises a method and an apparatus for controlling the etch rate of a semiconductor wafer utilizing consumable electrodes in a plasma etching apparatus. Some of the upper electrodes are designed to react with ionized gas to increase selectivity, for example, silicon doped with boron is used in the silicon dioxide (SiO2) etching process. Because the upper electrode's surface wears, its parallism and planarity relation to the bottom electrode is diminished with time and requires periodic replacement. Since most of the present processes use a fixed distance between the upper and lower electrodes, the pressure gradient between them becomes an important component in preserving etch rate in a pressure dominant process. While the upper electrode is consumed, the pressure gradient between electrodes shifts, thereby, affecting the etch rate. To counteract the effects of upper electrode consumption, gap height adjustment is necessary.

Figure 1:
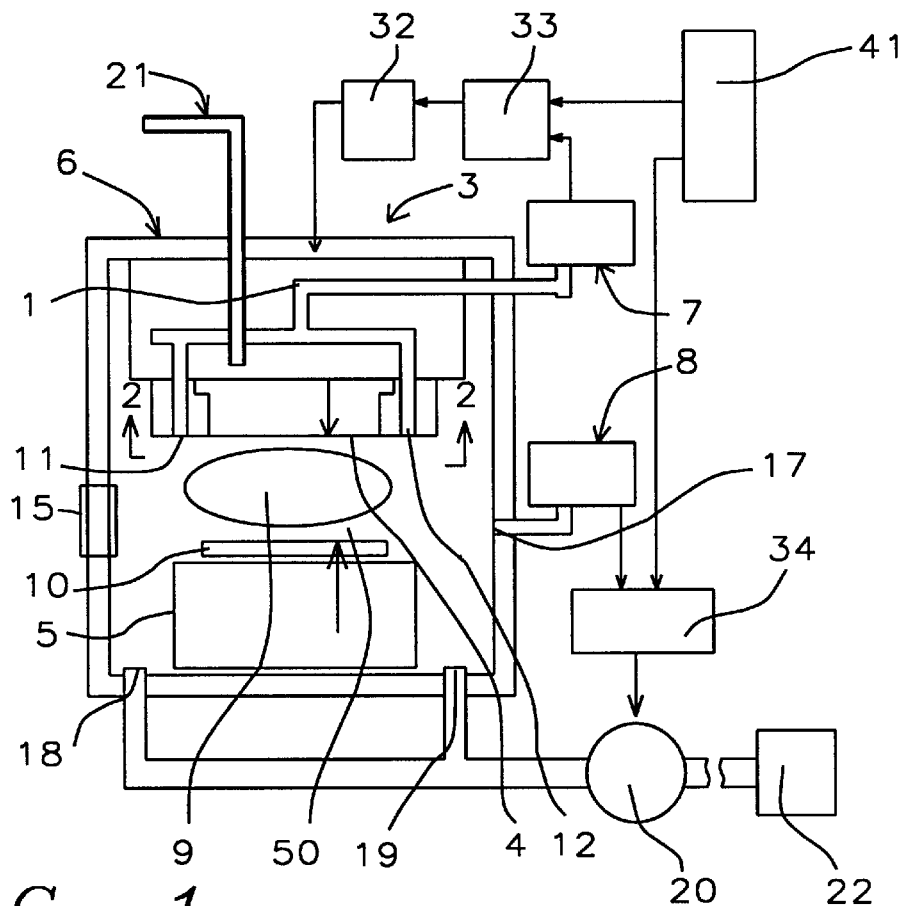
FIG. 1 is a fragmentary cross-sectional view of a portion of a plasma etching apparatus showing the present invention improvements.

Referring now to the drawings, and FIG. 1 in particular, there is illustrated a plasma etching apparatus or chamber 3 is generally indicated comprising a chamber wall 6, evacuation ports 18 and 19 which are connected to throttle valve 20 to an external pumping source 22 to maintain the desired pressure in chamber 3 and at least one interlock 15 through which a wafer 10 can be introduced into chamber 3. Within chamber 3 is an rf source (not shown) and an external power supply (not shown) that are used to generate the plasma field 9, and a wafer support pedestal resting on the bottom electrode 5 upon which a wafer 10 is positioned for etching by the plasma generated by the rf source. An inlet port 21 is also provided in chamber wall 6 for admission of process gas into etching chamber 3 from an external process gas source (not shown).

Figure 2:
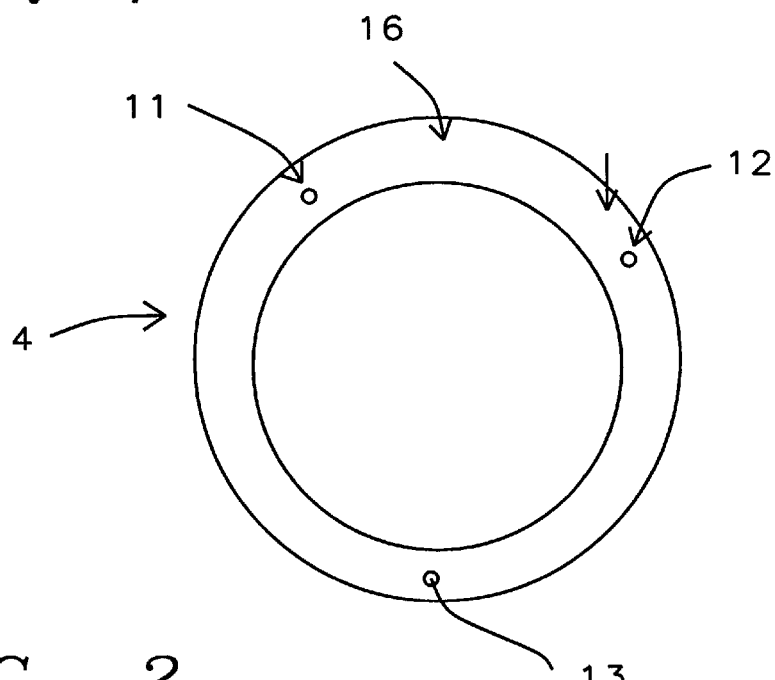
FIG. 2 is a view of the present invention looking at the underside of the upper electrode.

In accordance with the invention, means are provided for adjustment of gap height 50 by either on line or off-line process adjustment contained in set point control box 41 modes. The pressure gradient within the gap height 50 is used as feedback given by two manometers. The first manometer 8 senses the pressure within the chamber 3 by way of part 17 and is controlled by pressure controller 34 via throttle valve 20. This pressure is widely used as the process pressure representing the pressure around the lower electrode 5 and wafer 10. The second manometer 7 senses the pressure between the upper 4 and lower 5 electrodes within the plasma field gap 9. Referring now to FIG. 2, illustrating the underside surface of the upper electrode 4, the average pressure between the upper and lower electrode is transmitted from three ports 11, 12, 13 into pipe 1 and thereon to the gap controller 33. The three ports are equally spaced on the face of the upper electrode clamp 16 dividing the circle into 120° between port centers to produce a uniform pressure feedback between the electrodes. The pressure feedback is used to drive the gap driver 32 via gap controller 33. Based on this feedback, the gap controller repeatedly calculates new gap counts for the gap driver 32 to drive the gap assembly to a destined position. The etching process will not begin unless both the chamber and gap pressures match preset process parameters. The desired control options on-line or off-line, gap height tolerances, chamber and gap pressures, and wafer count can be set in process recipes or equipment configuration.

Figure 3A:
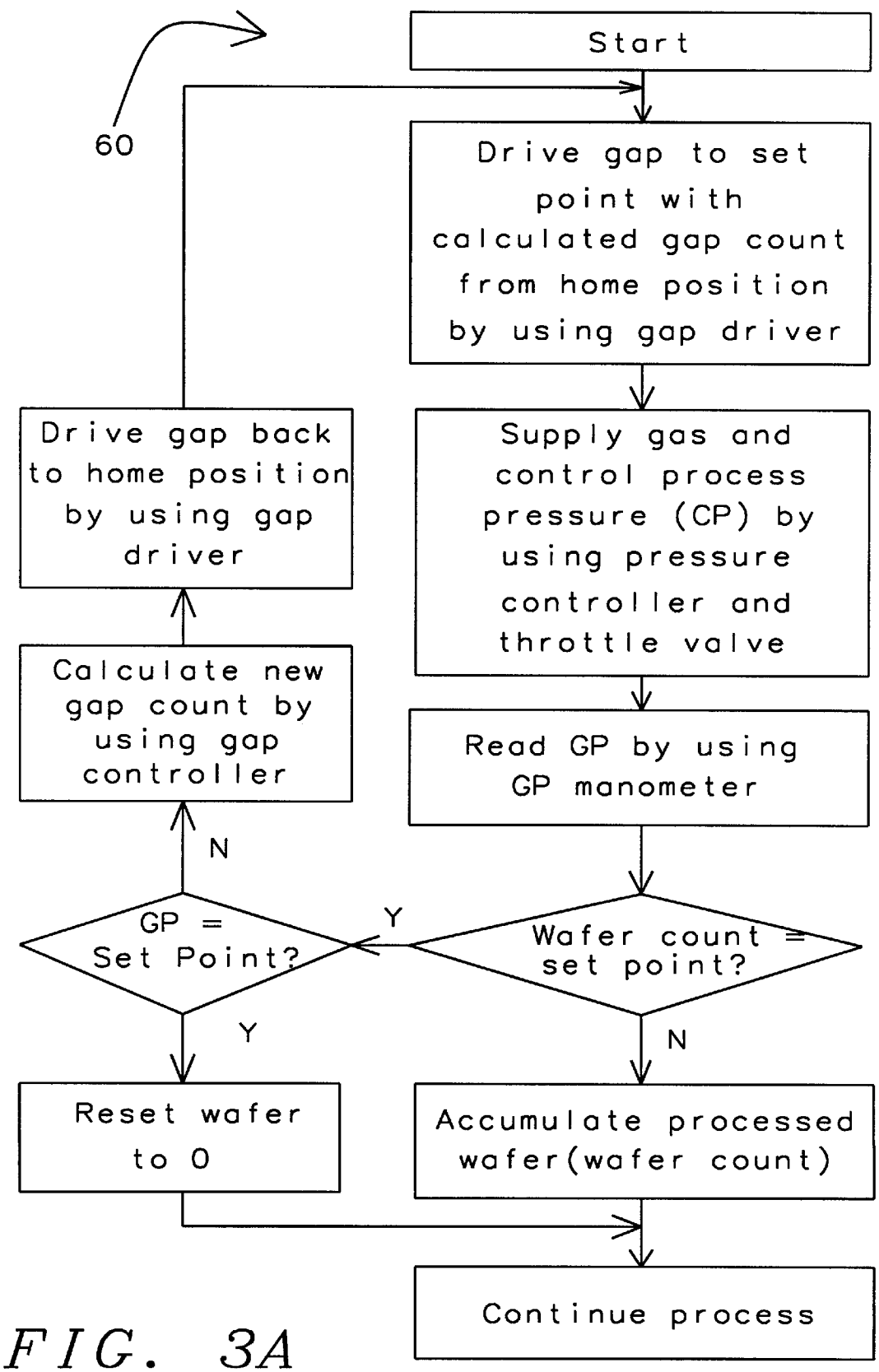
FIGS. 3A and 3B are flow sheets of the on-line and off-line process of the present invention.
Figure 3B:
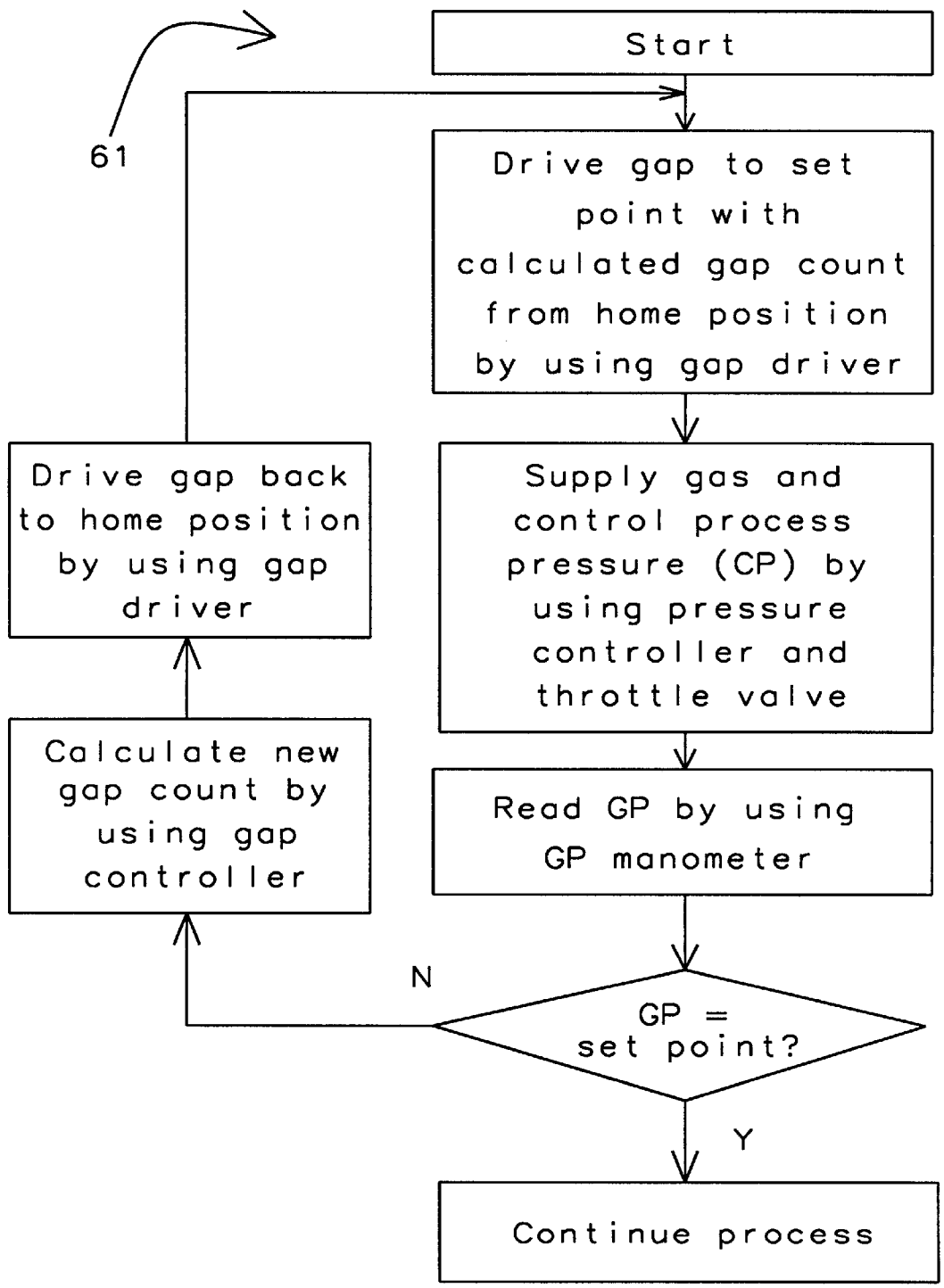

The on-line and off-line process flow charts are rendered in FIGS. 3A and 3B. The on-line process 61 shown in FIG. 3B provides gap height compensation for each wafer before the etching process begins by comparing the gap pressure to the gap set point pressure. The off-line process 60 differs since the process continues until the preset wafer count reaches a preset count and then, and only then, is the gap pressure compared to the gap set point pressure. If the gap pressure is not in agreement with the set point pressure, then the gap driver readjusts the gap in response to the gap controller. If the gap pressure is in agreement, the wafer count is reset to zero and the process continues.

Figure 4:
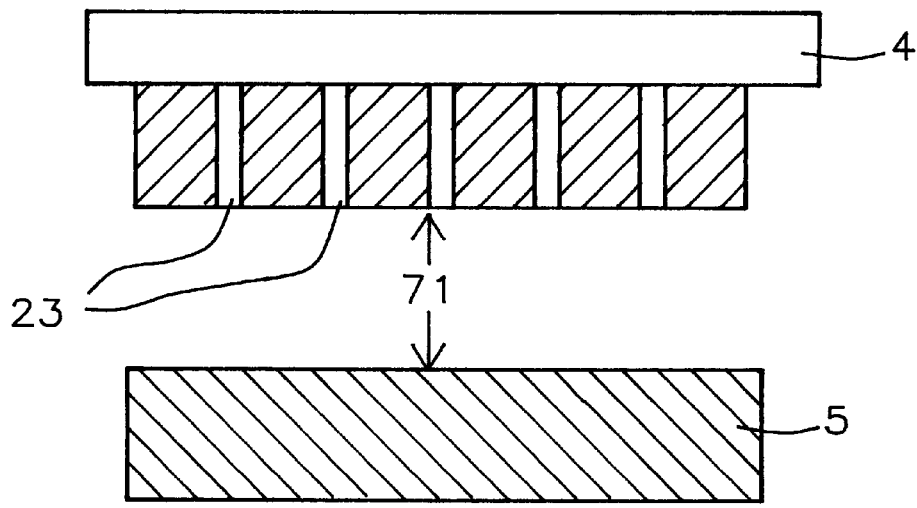
FIG. 4 illustrates a partial front elevation view of a new pair of electrodes of the prior art and of the present invention.
Figure 5:
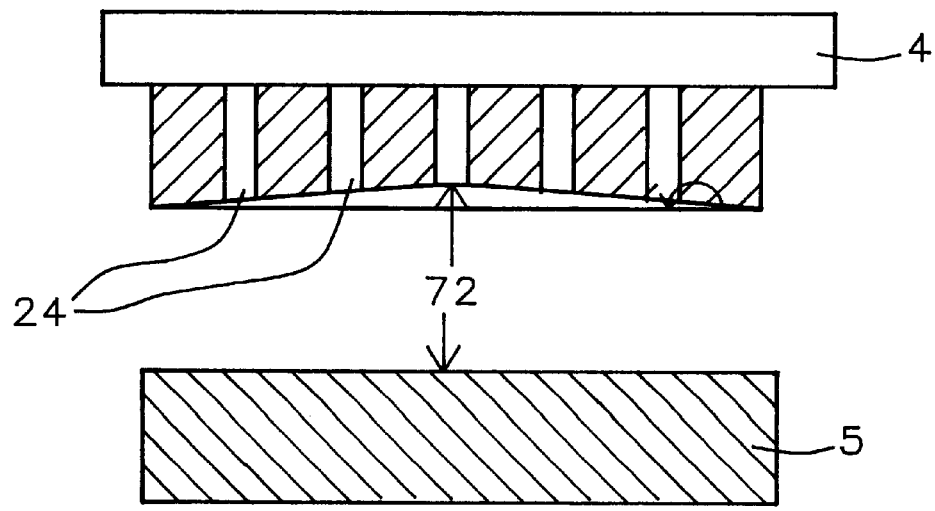
FIG. 5 illustrates a partial front elevation view of a used consumable upper electrode of the present invention.

Process selectivity is a major consideration of the present invention with methods to neutralize the effects of electrode consumption on etch rate during certain etching processes as in contact, via, or in SOG etching. Comparing FIG. 4 with FIG. 5 typifies the erosive effects when using consumable electrodes materials. FIG. 4 illustrates an unused consumable upper electrode 4 having a uniform and parallel gap 71 relative to lower electrode 5. FIG. 5 embodies the reduced surfaces of upper electrode 4 in the active etching areas after prolonged use. The concave surface of the upper electrode 4 and enlarged gas distribution holes 24, though exaggerated, are indications of the wearing results of the plasma etching process. Dimensions of gap 72 and gas distribution hole diameters 24 in FIG. 5 are no longer equal to gap 71 and gas distribution hole diameters 23 in FIG. 5.

FIG. 4, in a self explanatory manner, also illustrates the contrapositive effect of non-consumable electrodes, that is, no change in gap 71 or in the gas distribution hole diameters 23 after prolonged use.

One important factor of plasma etching is the chamber pressure that is monitored by a manometer giving feedback to a pressure controller for opening or closing a throttle valve to stabilize the desired chamber pressure. The second important factor is the gap height, the distance between the upper and lower electrodes preset to a given value and driven by a gap driver. Because of the erosion of the upper electrode, the preset gap height is no longer the desired value. Although the chamber pressure can be controlled at set point, the pressure gradient between the upper and lower electrodes has changed. The pressure gradient represents the dynamics of chamber gas flow. As the pressure gradient changes, etching time increases or reduces.

Figure 6:
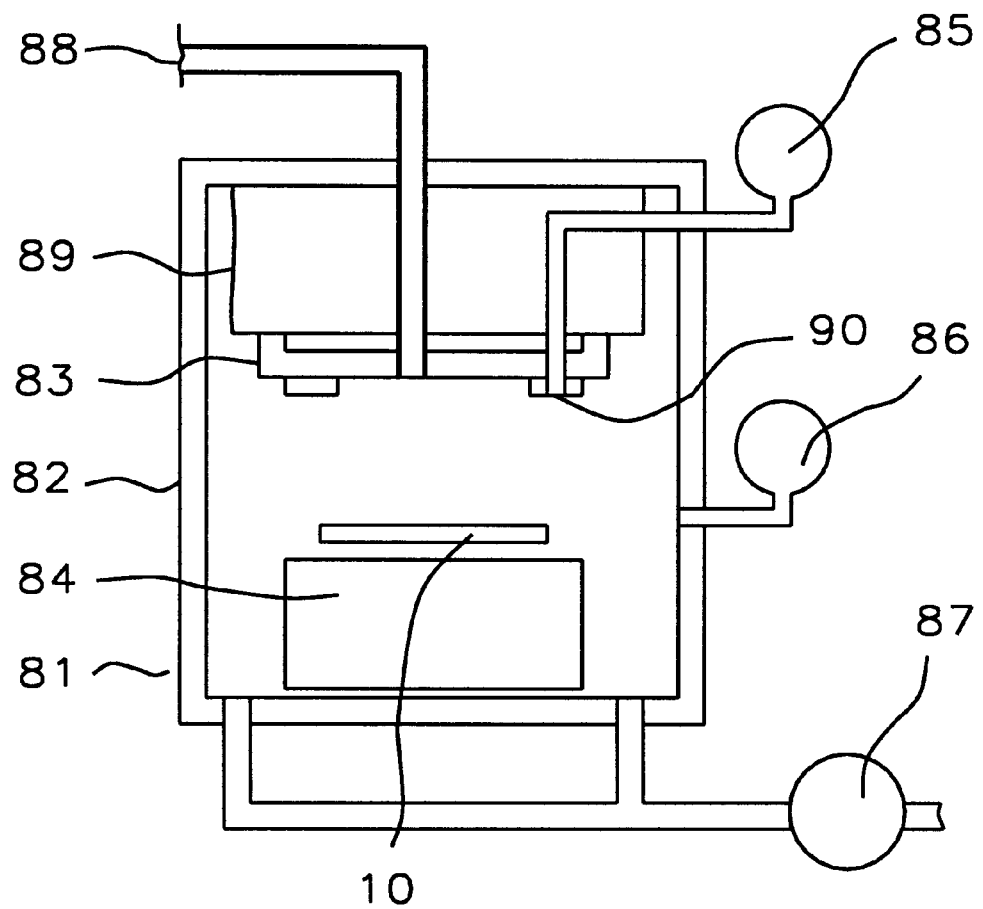
FIG. 6 is a schematic of the reactive ion etch chamber used for the process study of this invention.

Referring to FIG. 6, tests were conducted using a Lam Research Rainbow Model 4520 Reactive Ion Etcher 81. The chamber 82 included a 400 kHz RF source with a split power configuration (not shown), a silicon upper electrode 83, an anodized lower electrode 84 a gas inlet line 88, a gap driver 89, a dry pump 87 for chamber vacuum, a top-side clamp system and two (10 torr) capacitance manomometers 85 and 86. Manometer 86 is used as chamber pressure feedback to control chamber pressure via pressure controller and throttle valve control (not shown). Manometer 85 is designed to monitor the stability of plasma confinement by monitoring the pressure around the upper electrode 83. Since the sensing port 90 is immediate to the upper electrode it also precisely measures the pressure changes associated with upper electrode wear.

As previously stated, manometer 85 designed for sensing plasma confinement stability, is used in this test to sense the pressure around the upper electrode for interpolating upper electrode wear thus validating a primary object of this invention.

The test includes 3,500 wafers. During the first wet clean cycle, the gap pressure, (upper electrode pressure) is observed and the relation between gap pressure and etch rate is recorded. A gap pressure value is chosen for an etch rate of 4500 angstroms/min. The gap pressure value was chosen as a process parameter for continuous wet clean cycles. The electrode is consumed with increasing RF process time affecting the gap pressure and etch rate. To maintain the gap pressure within the process parameter, the gap height was adjusted within a limited available range. Etch rate and etch uniformity were checked after every 500 wafers processed based on a controlled gap pressure.

Figure 7:
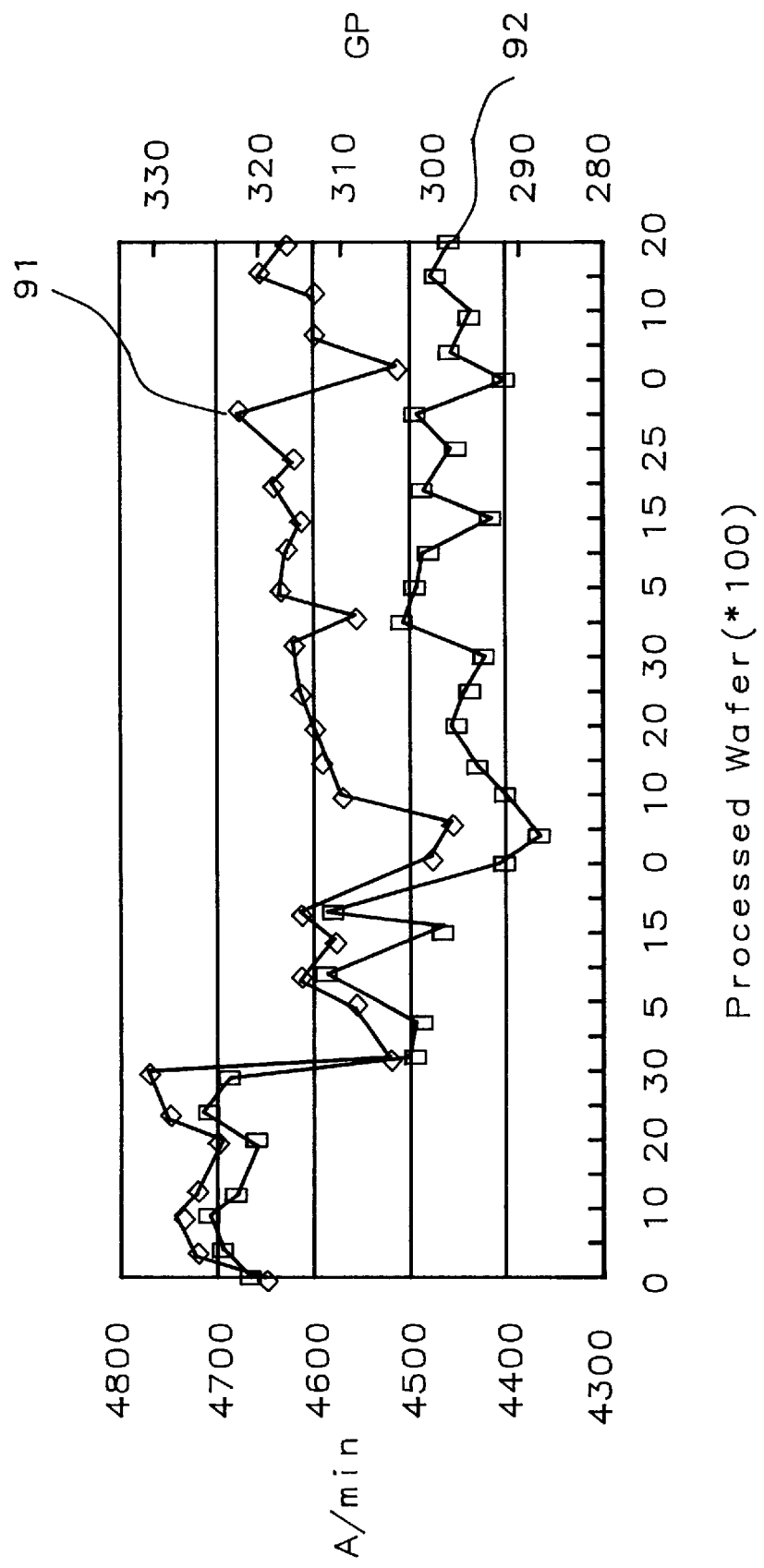
FIG. 7 is a plot, of the present invention, of etch rate (angstroms/minute) versus the number of wafers processed.

The etch rate 92 and gap pressure 91 trends are plotted in FIG. 7. During the first wet clean cycle, the gap pressure was 324 mtorr, the etch rate at 4700 angstroms/minute. At the start of the second cycle, the gap height was reduced by 10 counts or 0.1 mm, the gap pressure had reduced to 312 mtorr and the etch rate between 4500 and 4600 A/min. The ratio between gap height, gap pressure(GP) and etch rate is 1:1.2:10 respectively. Based on this ratio, the gap height is reduced by 4 counts (0.04 mm) during the third cycle. The gap pressure(GP) was 312 mtorr, and etch rate reduced by 50A/min. or 4500±50A/min. The total gap height reduction between the first and third cycle was used as a basis for establishing the set point for the GP of 315±5 mtorr. After four cycles or 14,000 processed wafers, the upper electrode is replaced at its expected serviceable life. The new electrode with its smooth surface affects the GP. The gap height is increased to 0.11 mm (11 counts) to maintain the GP at the established set point of 315 mtorr. FIG. 7 depicts a significant correlation between etch rate and the GP, suggesting that the etch rate can be controlled by the GP at an established range.

Figure 8:
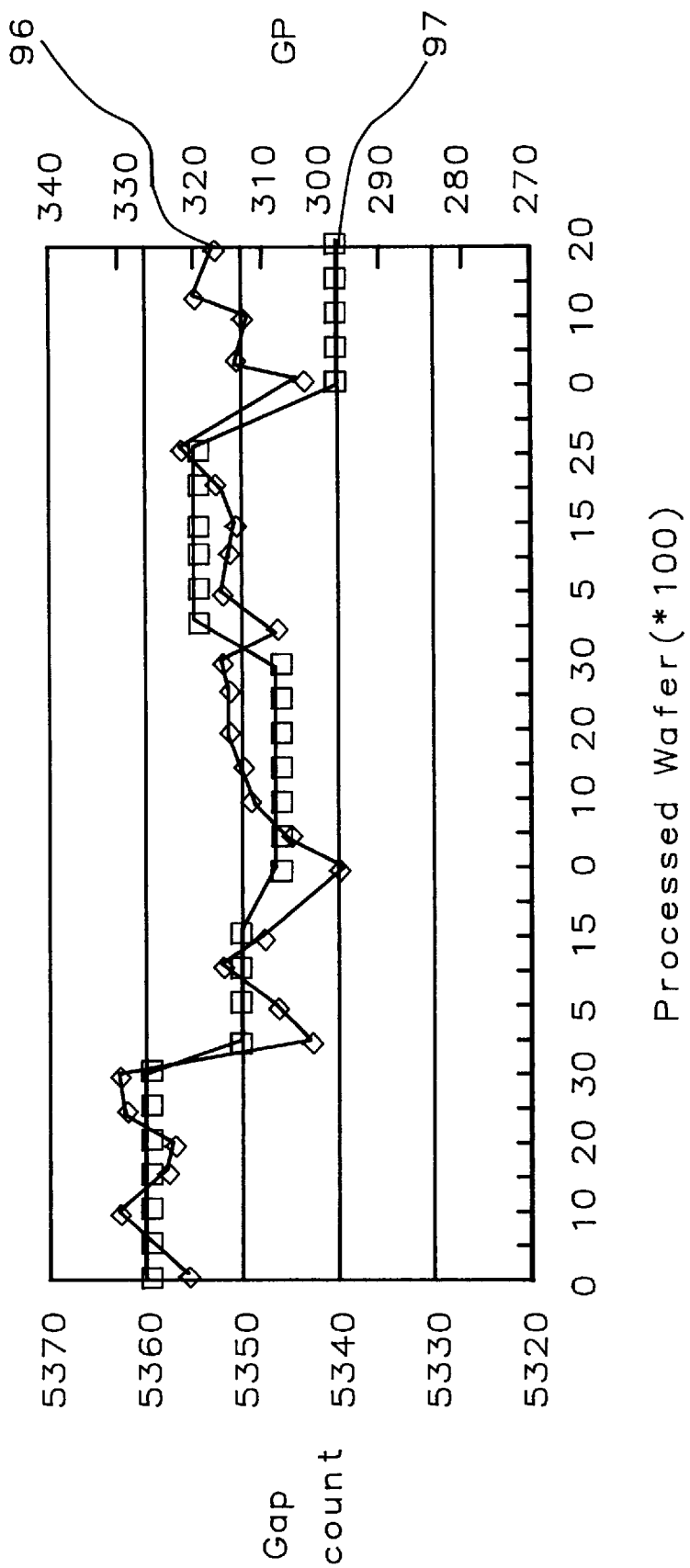
FIG. 8 is a plot, of the present invention, of the correlation of gap count and gap pressure versus the number of wafers processed.

FIG. 8 plots the relation between gap count 97 and GP 96 during the wet clean cycle, with the gap count held at a constant value. However, GP varies with increasing number of wafers processed indicating gap height adjustment is necessary. Adjustment is done after every 500 wafers are processed.

While the invention has been particularly shown and described with reference to the preferred embodiments thereof, it will be understood by those skilled in the art that various changes in form and details may be made without departing from the spirit and scope of the invention.

What is claimed is:

1. A method for controlling etching rate for semiconductor substrates during a plasma assisted chemical etching process when using a consumable upper electrode and a non-consumable lower electrode to extend process selectivity comprising the steps of:

a) providing a first pressure manometer to measure chamber pressure in the vicinity of the lower non-consumable electrode;

b) providing a second pressure manometer to measure a gap pressure between the upper consumable and lower non-consumable electrode;

c) providing automatic means for adjusting the upper consumable electrode to maintain a fixed gap dimension intermediate the upper consumable and lower non-consumable electrodes;

d) establishing process parameters using feedback from the first and second pressure manometers;

e) establishing an ideal gap dimension intermediate the upper consumable and lower non-consumable electrodes as a reference point to adjust to and compensate for wearing away of the consumable upper electrode; and f) automatically adjusting the gap dimension and the chamber pressure by either on-line or off-line options.

2. The plasma assisted chemical etching processing method according to claim 1, wherein feedback from said first and second pressure manometers is applied to holdconstant a gap pressure between the upper consumable and a lower non-consumable electrodes using a pressure controller and a gap controller.

3. The plasma assisted chemical etching processing method according to claim 1, wherein feedback from said first pressure manometer controls the chamber pressure to within a process parameter.

4. The plasma assisted chemical etching processing method according to claim 1, wherein feedback from said second pressure manometer is repeatedly converted to gap adjustment counts by a gap controller and used to automatically drive the upper consumable electrode to a new position by a gap driver and to make the new position conform to a predetermined ideal gap dimension.

5. The plasma assisted chemical etching processing method according to claim 1, wherein selecting said on-line option automatically adjusts the gap dimension thereby ensuring a preset ideal gap pressure intermediate the upper consumable electrode and lower non-consumable electrode for each semiconductor substrate before plasma etching begins.

6. The plasma assisted chemical etching processing method according to claim 1, wherein said off-line option, to adjust the gap dimension, ensure a preset ideal gap pressure intermediate the upper consumable electrode and lower non-consumable electrode after a preset number of semiconductor substrates are processed.

* * * * *